US011201234B1

(12) United States Patent
Huang et al.

(10) Patent No.: US 11,201,234 B1
(45) Date of Patent: Dec. 14, 2021

(54) HIGH ELECTRON MOBILITY TRANSISTOR

(71) Applicant: Vanguard International Semiconductor Corporation, Hsinchu (TW)

(72) Inventors: Chia-Ching Huang, Taoyuan (TW); Chih-Yen Chen, Tainan (TW); Chun-Yi Wu, Taichung (TW); Chih-Jen Hsiao, Yilan County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 17/015,025

(22) Filed: Sep. 8, 2020

(51) Int. Cl.
*H01L 29/778* (2006.01)
*H01L 29/47* (2006.01)
*H01L 29/20* (2006.01)
*H01L 29/66* (2006.01)

(52) U.S. Cl.
CPC ........ *H01L 29/778* (2013.01); *H01L 29/2003* (2013.01); *H01L 29/475* (2013.01); *H01L 29/66462* (2013.01)

(58) Field of Classification Search
CPC . H01L 29/778; H01L 29/2003; H01L 29/475; H01L 29/66462
See application file for complete search history.

(56) References Cited

U.S. PATENT DOCUMENTS 8,564,020 B2  10/2013  Chen
8,809,987 B2  8/2014  Chen
9,577,048 B1*  2/2017  Yang ..................... H01L 29/205
2012/0267637 A1  10/2012  Jeon
2016/0035853 A1*  2/2016  Kaneko .............. H01L 29/0619
257/194

FOREIGN PATENT DOCUMENTS

TW  I676237 B  11/2019
TW  I681561 B  1/2020
TW  I686951 B  3/2020

OTHER PUBLICATIONS

Jiacheng Lei et al., Reverse-Blocking AlGaN/GaN Normally-Off MIS-HEMT with Double-Recessed Gated Schottky Drain, Proceedings of the 30th International Symposium on Power Semiconductor Devices & ICs, May 13-17, 2018, Chicago, USA, 2018 IEEE, pp. 276-279.

* cited by examiner

*Primary Examiner* — Mohammed R Alam
(74) *Attorney, Agent, or Firm* — Winston Hsu

(57) ABSTRACT

A high-electron mobility transistor (HEMT) includes a substrate, a group III-V channel layer, a group III-V barrier layer, a group III-V cap layer, a source electrode, a first drain electrode, a second drain electrode, and a connecting portion. The group III-V channel layer, the group III-V barrier layer, and the group III-V cap layer are sequentially disposed on the substrate. The source electrode is disposed at one side of the group III-V cap layer, and the first and second drain electrodes are disposed at another side of the group III-V cap layer. The bottom surface of the first drain electrode is separated from the bottom surface of the second drain electrode, and the composition of the first drain electrode is different from the composition of the second drain electrode. The connecting portion is electrically coupled to the first drain electrode and the second drain electrode.

18 Claims, 9 Drawing Sheets

HIGH ELECTRON MOBILITY TRANSISTOR

BACKGROUND OF THE INVENTION

1. Field of the Invention

The present disclosure relates generally to the field of semiconductor devices, and more particularly to high-electron mobility transistors.

2. Description of the Prior Art

In semiconductor technology, group III-V semiconductor compounds may be used to construct various integrated circuit (IC) devices, such as high power field-effect transistors (FETs), high frequency transistors, or high-electron mobility transistors (HEMTs). A HEMT is a field effect transistor having a two dimensional electron gas (2-DEG) layer close to a junction between two materials with different band gaps (i.e., a heterojunction). The 2-DEG layer is used as the transistor channel instead of a doped region, as is generally the case for metal oxide semiconductor field effect transistors (MOSFETs). Compared with MOSFETs, HEMTs have a number of attractive properties such as high electron mobility and the ability to transmit signals at high frequencies.

For a conventional HEMT, an ohmic contact is often formed between a drain electrode and the underlying semiconductor layer of the HEMT, and the contact resistance between the drain electrode and the underlying semiconductor layer could be kept low because of the existence of the ohmic contact. However, during the formation of the ohmic contact, undesired spiking defects are often formed at the bottom of the drain electrode due to the reaction between the metal in the drain electrode and the semiconductor in the underlying semiconductor layer. Because of the spiking defects, an electric field near the spiking defects may become relatively high (also called E-field crowding), which inevitably causes unnecessary current leakage. As a result, the $I_{OFF}$ of the HEMT is increased, and the break down voltage ($V_{BR}$) and the reliability of the HEMT are decreased.

SUMMARY OF THE INVENTION

In view of this, it is necessary to provide an improved high-electron mobility transistor without the drawbacks described above.

According to one embodiment of the present disclosure, a high electron mobility transistor is provided. The high electron mobility transistor (HEMT) includes a substrate, a group III-V channel layer, a group III-V barrier layer, a group III-V cap layer, a source electrode, a first drain electrode, a second drain electrode, and a connecting portion. The group III-V channel layer, the group III-V barrier layer, and the group III-V cap layer are sequentially disposed on the substrate. The source electrode is disposed at one side of the group III-V cap layer, and the first and second drain electrodes are disposed at another side of the group III-V cap layer. The bottom surface of the first drain electrode is separated from the bottom surface of the second drain electrode, and the composition of the first drain electrode is different from the composition of the second drain electrode. The connecting portion is electrically coupled to the first drain electrode and the second drain electrode.

According to another embodiment of the present disclosure, a high-voltage semiconductor device is provided. The high-voltage semiconductor device includes semiconductor layer, semiconductor cap layer, a source electrode, at least two drain electrodes, and an interlayer dielectric. The semiconductor layer is disposed on a substrate, and the semiconductor cap layer is disposed on the semiconductor layer. The source electrode is disposed at one side of the semiconductor cap layer. The two drain electrodes are disposed at another side of the semiconductor cap layer, where each of the two drain electrodes includes a Schottky contact metal and an ohmic contact metal. The interlayer dielectric is disposed between the Schottky contact metal and the ohmic contact metal.

According to some embodiments of the present disclosure, a high-voltage device may include a first drain electrode and a second drain electrode laterally separated from each other, where there is a Schottky contact between the first drain electrode and the underlying semiconductor layer, and there is an ohmic contact between the second drain electrode and the underlying semiconductor layer. Thus, the distribution of the electric field at the surface of the high-voltage device may be improved without overly increasing the contact area between the drain electrode and the underlying semiconductor layer, thereby not only reducing the $I_{OFF}$ of the device but also avoiding the increase in the $R_{ON}$ of the device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
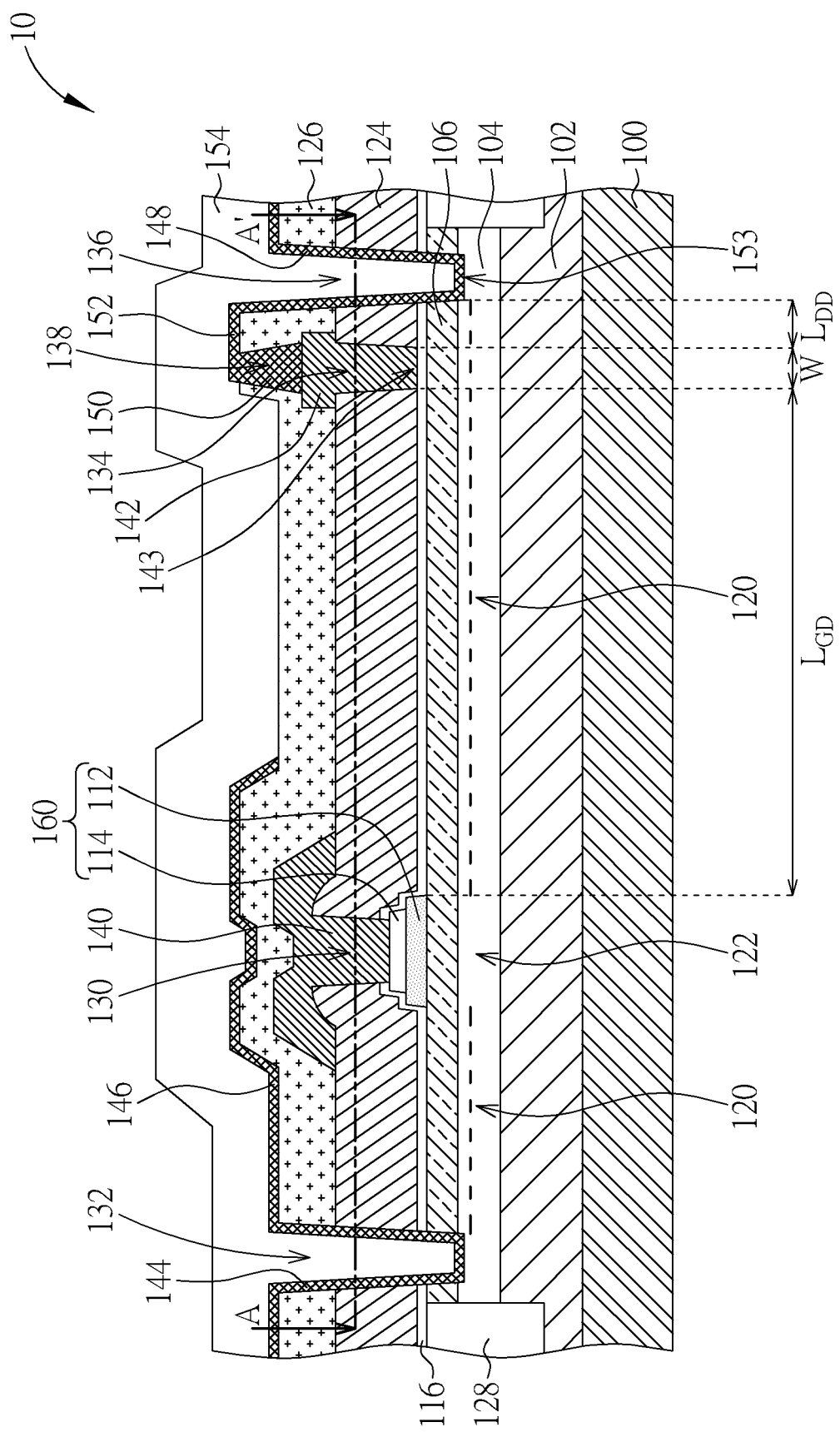
FIG. 1 is a schematic cross-sectional diagram of a high-voltage semiconductor device according to one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, GaInP, AlGaAs, InAlAs, InGaAs, or the like, or the combination thereof. Besides, based on different requirements, group III-V semiconductor may contain dopants to become semiconductor with specific conductivity type, such as N-type or P-type.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

The present disclosure is directed to high voltage semiconductor devices or high electron mobility transistors (HEMTs), such as power switching transistors for voltage converter applications. Compared to silicon power transistors, III-V HEMTs feature low on-state resistance ($R_{ON}$) and low switching losses due to wide bandgap properties.

FIG. 1 is a schematic cross-sectional diagram of a high-voltage semiconductor device according to one embodiment of the disclosure. Referring to FIG. 1, a high-voltage semiconductor device, such as an enhancement mode high-electron mobility transistor (HEMT) 10, is disposed on a substrate 100. Multiple layers may be stacked on the substrate 100 in sequence, and the layers may be a buffer layer 102, a group III-V channel layer 104, a group III-V barrier layer 106, a passivation layer 116, and at least one interlayer dielectric (such as a first interlayer dielectric 124, a second interlayer dielectric 126, and a third interlayer dielectric 154). An electrical isolation may be disposed on the two sides of the group III-V channel layer 104 and the group III-V barrier layer 106.

A stack structure 160 may include a group III-V cap layer 112 and an etch stop layer 114 stacked in sequence on the surface of the group III-V barrier layer 106. A gate electrode 140 may be disposed in a gate contact hole 130 in the first interlayer dielectric 124. Since the stack structure 160 may be exposed from the gate contact hole 130, the gate electrode 140 may be electrically coupled to the underlying stack structure 160.

A source electrode 144 may be disposed at one side of the stack structure 160 and conformally disposed in a source contact hole 132 in the first interlayer dielectric 124. There is an ohmic contact between the source electrode 144 and the underlying semiconductor layer, such as a group III-V channel layer 104. A field plate 146 may be disposed along a top surface of the second interlayer dielectric 126 and cross over the stack structure 160. The field plate 146 may be electrically coupled to the source electrode 144 in order to adjust the distribution of electric field in a semiconductor layer (such as the group III-V channel layer 104 and/or the group III-V barrier layer 106). According to one embodiment of the present disclosure, the field plate 146 and the source electrode 144 may be formed through the same deposition process, so that they may have the same composition, but not limited thereto.

According to one embodiment, the compositions of the gate electrode 140 and the source electrode 144 may include electrically conductive materials, such as metals, alloys, metal nitrides, or semiconductor materials. In some embodiments, the metal may include gold (Au), nickel (Ni), platinum (Pt), palladium (Pd), iridium (Ir), titanium (Ti), chromium (Cr), tungsten (W), aluminum (Al), copper (Cu), molybdenum (Mo) and other suitable electrically conductive materials, or the combination thereof.

At least two drain electrodes, such as a first drain electrode 142 and a second drain electrode 148, may be disposed opposite to the source electrode 144 and disposed on the other side of the stack structure 160. The first drain electrode 142 may be disposed in a first drain contact hole 134 in the first interlayer dielectric 124, and the composition of the first drain electrode 142 may be the same as the composition of the gate electrode 140. For example, the composition of the first drain electrode 142 may include Schottky contact metal. According to one embodiment of the present disclosure, the bottom surface 143 of the first drain electrode 142 may be disposed on the passivation layer 116. In one embodiment, the bottom surface 143 of the first drain electrode 142 may be optionally electrically coupled to the underlying semiconductor layer, such as the group III-V barrier layer 106, to thereby form a Schottky contact. According to one embodiment of the present disclosure, the first drain electrode 142 may penetrate the passivation layer 116 and be electrically coupled to the underlying semiconductor layer, but not limited thereto. According to the present disclosure, the Schottky contact metal may refer to a metal, an alloy or a stack layer thereof that may produce Schottky contact with the semiconductor layer that is in contact with the Schottky contact metal, such as TiN, W, Pt, Ni or Ni/Au, but not limited thereto. Moreover, the second drain electrode 148 may be disposed in the second drain contact hole 136 of the first interlayer dielectric 124, and the second drain contact hole 136 may be laterally separated from the first drain contact hole 134. The composition of the second drain electrode 148 may be different from the compositions of the gate electrode 140 and the first drain electrode 142, but may have the same composition as the first source electrode 144. For example, the composition of the second drain electrode 148 may include ohmic contact metal. The bottom surface of the second drain electrode 148 may be electrically coupled to the underlying semiconductor layer, such as the group III-V channel layer 104, to thereby form an ohmic contact. According to the present disclosure, the ohmic contact metal may refer to a metal, an alloy or a stack layer thereof that may produce ohmic contact with the semiconductor layer that is in contact with the ohmic contact metal, such as Ti/Al, Ti/Al/Ti/TiN, Ti/Al/Ti/Au, Ti/Al/Ni/Au or Ti/Al/Mo/Au, but not limited thereto.

Further, the first drain electrode 142 may be electrically coupled to the second drain electrode 148. For example, the first drain electrode 142 may be electrically coupled to the second drain electrode 148 through a connection portion disposed above the first drain electrode 142. For example, the connecting portion may include a conducting plug 150 and a conducting interconnection 152, where the conducting plug 150 may be disposed in the opening 138 of the second interlayer dielectric 126, and the conducting interconnection 152 may be conformally disposed on the top surface of the second interlayer dielectric 126. According to one embodiment of the present disclosure, the connecting portion (e.g. the conducting plug 150 or the conducting interconnection 152) and the second drain electrode 148 may be formed through the same deposition process, so that these components may include the same composition, but not limited thereto. According to some embodiments of the present disclosure, the composition of the connecting portion (e.g. the conducting plug 150 or the conducting interconnection 152) may be the same as the composition of the first drain electrode 142 but different from the composition of the second drain electrode 148. In addition, the composition of the connecting portion may also be chosen from other metals or alloys, which is different from the composition of the first drain electrode 142 and the second drain electrode 148.

According to one embodiment of the present disclosure, the bottom surface 143 of the first drain electrode 142 may be higher than a portion of the bottom surface 153 of the second drain electrode 148, and the bottom surface 143 of the first drain electrode 142 is separated from the portion of bottom surface 153 of the second drain electrode 148 so that the bottom surface 143 of the first drain electrode 142 and the bottom surface 153 of the second drain electrode 148 may contact different semiconductor layers respectively. In addition, the first interlayer dielectric 124 may be disposed between the first drain electrode 142 and the second drain electrode 148, and a second interlayer dielectric 126 may be disposed between the conducting plug 150 and the second drain electrode 148.

According to one embodiment of the present disclosure, because the first drain electrode 142 and the second drain electrode 148 are respectively arranged in the first drain contact hole 134 and the second drain contact hole 136, the width W of the bottom surface of the first drain electrode 142 and the distance $L_{DD}$ between the first drain electrode 142 and the second drain electrode 148 may be adjusted independently. In addition, the width W of the bottom surface of the first drain electrode 142 and the distance $L_{GD}$ between the stack structure 160 and the first drain electrode 142 may also be adjusted independently. In other words, the increase or decrease in the width W of the bottom surface of the first drain electrode 142 may not necessary affect (i.e. increase or decrease) the distance $L_{DD}$ and the distance $L_{GD}$. Since the increase in the width W of the bottom surface of the first drain electrode 142 usually results in an increase in the on-resistance ($R_{ON}$) of the device, it is desirable to reduce the off-current ($I_{OFF}$) by modulating the distribution of electric field in the device while keeping the on-resistance of the device at the same value. Thus, according to one embodiment of the present disclosure, the distance $L_{GD}$ between the first drain electrode 142 and the stack structure 160 may be adjusted arbitrarily without changing the width W of the bottom surface of the first drain electrode 142. In this way, the distribution of the electric field (or electric potential) in the group III-V barrier layer 106 and the group III-V channel layer 104 may be optimized to further reduce the off-current of the high-voltage semiconductor device.

According to some embodiments of the present disclosure, the substrate 100 may be a bulk silicon substrate, a ceramic substrate, such as a silicon carbide (SiC) substrate, a sapphire ($Al_2O_3$) substrate, or an aluminum nitride (AlN) substrate, a silicon-on-insulator (SOI) substrate, or a germanium-on-insulator (GOI) substrate, but not limited thereto. According to some embodiments the present disclosure, the substrate 100 may further includes single-layered or multi-layered isolation layers and/or other suitable material layers, such as semiconductor layers, and a core layer. The isolation layers may be composed of oxide, nitride, oxynitride, or other suitable isolation material. The core layer may be composed of silicon carbide (SiC), aluminum nitride (AlN), aluminum gallium nitride (AlGaN), zinc oxide (ZnO) or gallium oxide ($Ga_2O_3$), or other suitable ceramic materials. According to one embodiment of the present disclosure, the single-layered or multi-layered isolation layers and/or other suitable material layers may wrap around the core layer. According to one embodiment of the present disclosure, the group III-V channel layer 104 may include one or more layers of group III-V semiconductor composed of GaN, AlGaN, InGaN, or InAlGaN, but not limited thereto. A buffer layer 102 is used to alleviate not only the stress accumulated between the substrate 100 and the group III-V channel layer 104 but the lattice mismatch between the substrate 100 and the group III-V channel layer 104. In addition, the group III-V channel layer 104 may also be one or more layers of doped group III-V semiconductor, such as p-type III-V semiconductor. For the p-type group III-V semiconductor, the dopants of which may be C, Fe, Mg or Zn, but is not limited thereto. The group III-V barrier layer 106 may include one or more layers of group III-V semiconductor with the composition different from that of the group III-V semiconductor of the group III-V channel layer 104. For example, the group III-V barrier layer 106 may include AlN, $Al_yGa_{(1-y)}N$ (0<y<1), or a combination thereof. In accordance with one embodiment, the group III-V channel layer 104 may be an undoped GaN layer, and the group III-V barrier layer 106 may be an intrinsic n-type AlGaN layer. Since there is a bandgap discontinuity between the group III-V channel layer 104 and the group III-V barrier layer 106, by stacking the group III-V channel layer 104 and the group III-V barrier layer 106 on each other, a thin layer of two-dimensional electron gas (2-DEG), may be accumulated in a region, i.e., 2-DEG region 120, near the heterojunction between the group III-V channel layer 104 and the group III-V barrier layer 106 due to the piezoelectric effect. In contrast, 2-DEG may not be generated in the region covered by the group III-V cap layer 112, and thus this region may be regarded as a 2-DEG cutoff region 122. According to one embodiment of the present disclosure, since the first drain electrode 142 does not deep down to the group III-V barrier layer 106, the 2-DEG region 120 may be formed under the first drain electrode 142. The group III-V cap layer 112 may include one or more layers of group III-V semiconductor composed of GaN, AlGaN, InGaN, or InAlGaN, but not limited thereto. In addition, the group III-V cap layer 112 may also include one or more layers of doped group III-V semiconductor, such as p-type III-V semiconductor. For the p-type group III-V semiconductor, the dopants may be C, Fe, Mg or Zn, but not limited thereto. The group III-V cap layer 112 may be p-type GaN in accordance according to one embodiment of the present disclosure. The etch stop layer 114 may be composed of metal nitride, such as titanium nitride, and the etch stop layer 114 and the first interlayer dielectric 124 may be etched in different rates during an etching process. According to one embodiment of the present disclosure, the passivation layer 116 may be a thin dielectric layer with a thickness of 0.5 nm to 10 nm, and the passivation layer 116 may be used to eliminate or reduce the surface defects existing on both the sidewalls of the group III-V channel layer 104 and the top surface of the group III-V barrier layer 106, thereby enhancing the electron mobility in the 2-DEG region 120. According to one embodiment of the present disclosure, the passivation layer 116 may be silicon nitride (SiN), silicon oxynitride (SiON), aluminum nitride (AlN), aluminum oxide ($Al_2O_3$), or silicon oxide ($SiO_2$), but not limited thereto.

Figure 2:
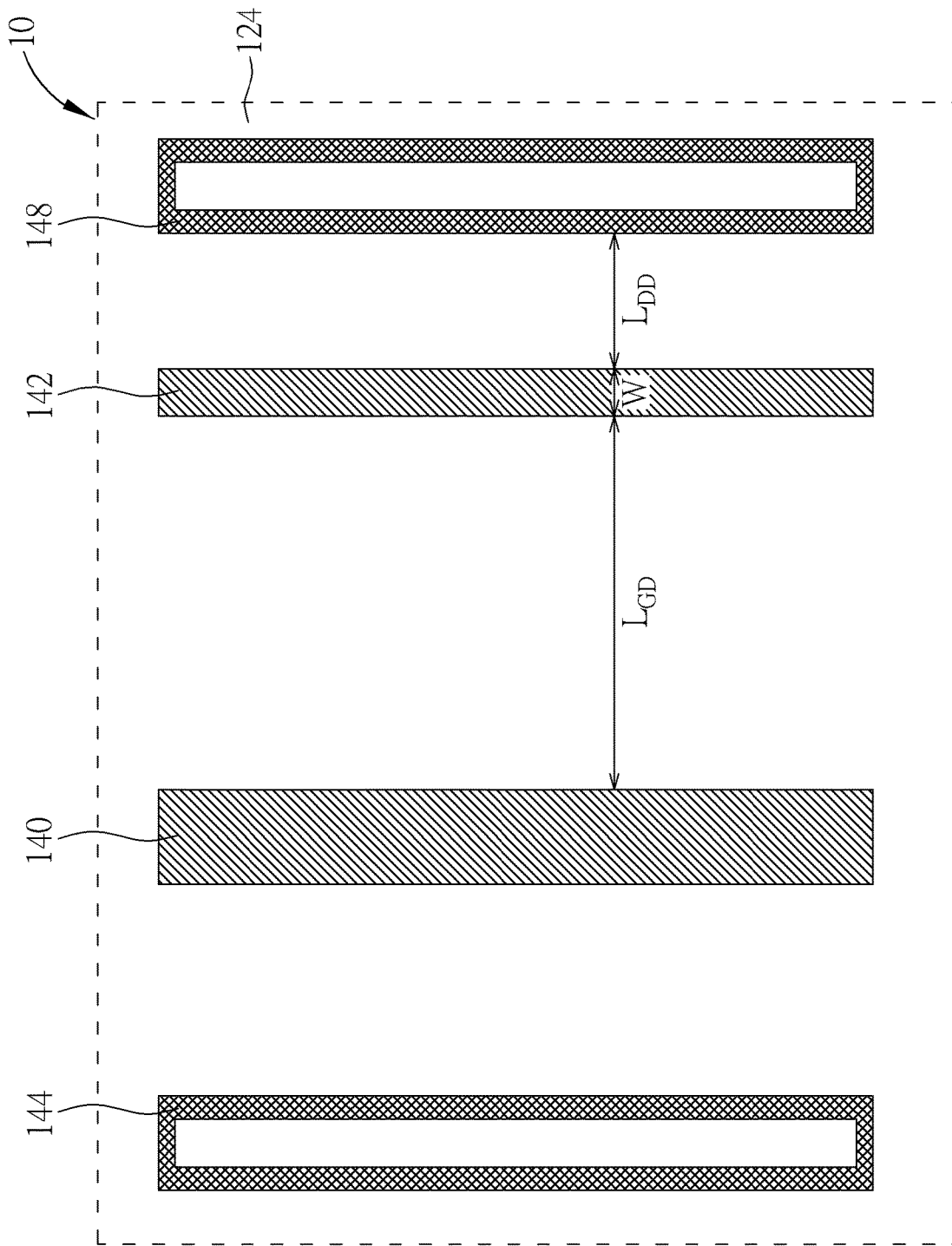
FIG. 2 is a schematic top view of a high-voltage semiconductor device taken along a line A-A' of FIG. 1 according to one embodiment of the present disclosure.

FIG. 2 is a schematic top view of a high-voltage semiconductor device taken along a line A-A' in FIG. 1 according to one embodiment of the present disclosure. Referring to FIG. 2, the gate electrode 140, the source electrode 144, the first drain electrode 142, and the second drain electrode 148 may be arranged in parallel, so that their long axes may be parallel to each other. According to one embodiment of the present disclosure, the gate electrode 140 and the first drain electrode 142 are each in a strip shape, and the source electrode 144 and the second drain electrode 148 are each in a ring shape, but not limited thereto. According to one embodiment of the disclosure, the gate electrode 140, the source electrode 144, the first drain electrode 142, and the second drain electrode 148 may be arbitrarily a strip shape or a ring shape. Furthermore, according to one embodiment of the present disclosure, one of the source electrode 144 and the second drain electrode 148 may be in a circular shape, so that the other of the source electrode 144 and the second drain electrode 148, the first drain electrode 142, and the gate electrode 140 may surround the periphery of the circular electrode to form a concentric electrode.

Figure 3:
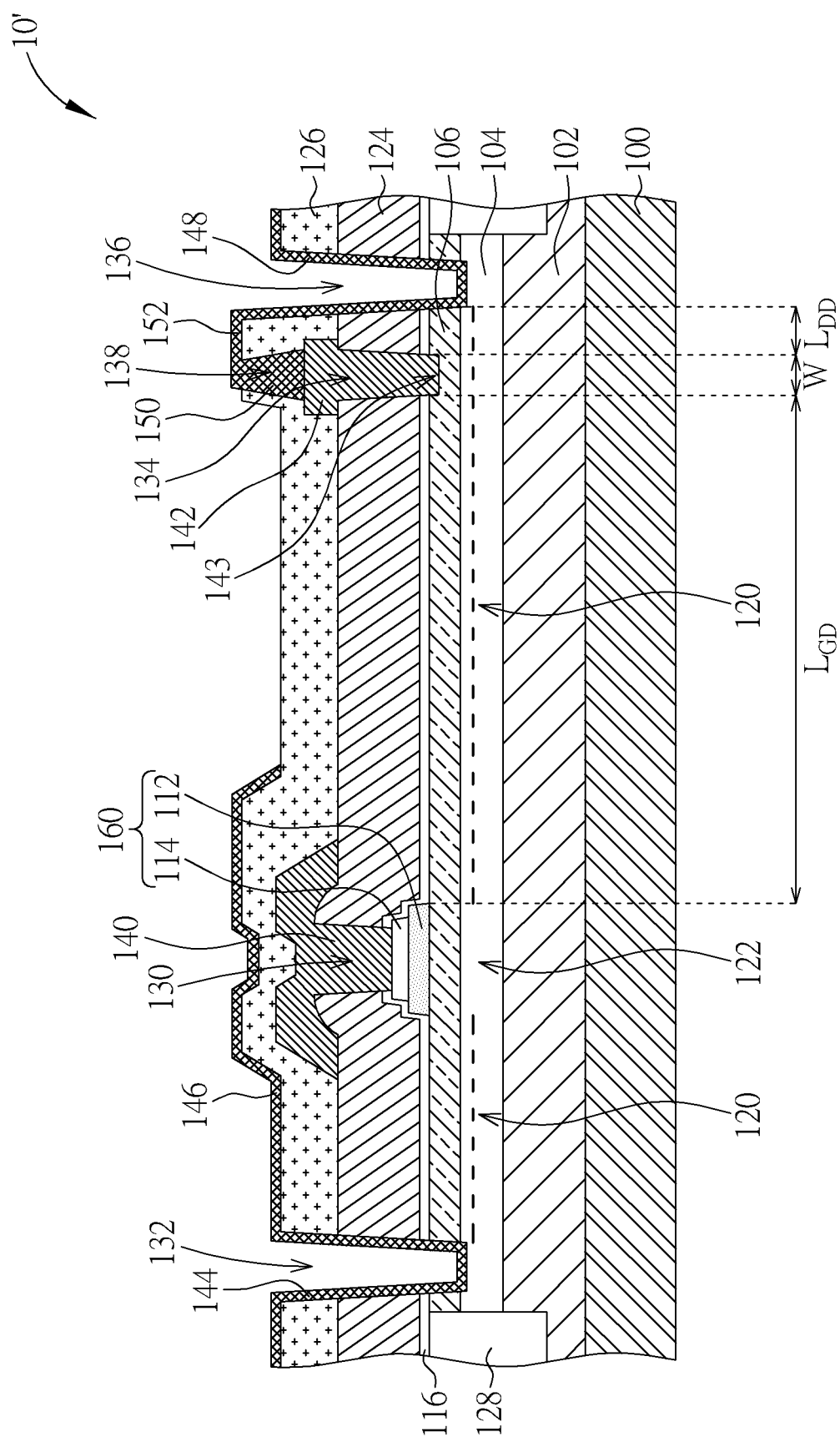
FIG. 3 is a schematic cross-sectional diagram of a high-voltage semiconductor device with a plurality of drain electrodes according to one embodiment of the present disclosure.

FIG. 3 is a schematic cross-sectional diagram of a high-voltage semiconductor device with a plurality of drain electrodes according to one embodiment of the present disclosure. The high-voltage semiconductor device shown in FIG. 2 may be, for example, an enhancement-mode high electron mobility transistor 10', and its structure is similar to the enhancement-mode high electron mobility transistor 10 shown in FIG. 1. However, the main difference between the embodiment shown in FIG. 2 and the embodiment shown in FIG. 1 is that the first drain electrode 142 shown in FIG. 2 may penetrate into the group III-V barrier layer 106. Thus, the first drain electrode 142 may more effectively manipulate the distribution of electric field (or electric potential) in the group III-V barrier layer 106 and the group III-V channel layer 104, thereby successfully reducing the off-current of the high-voltage semiconductor device.

Figure 4:
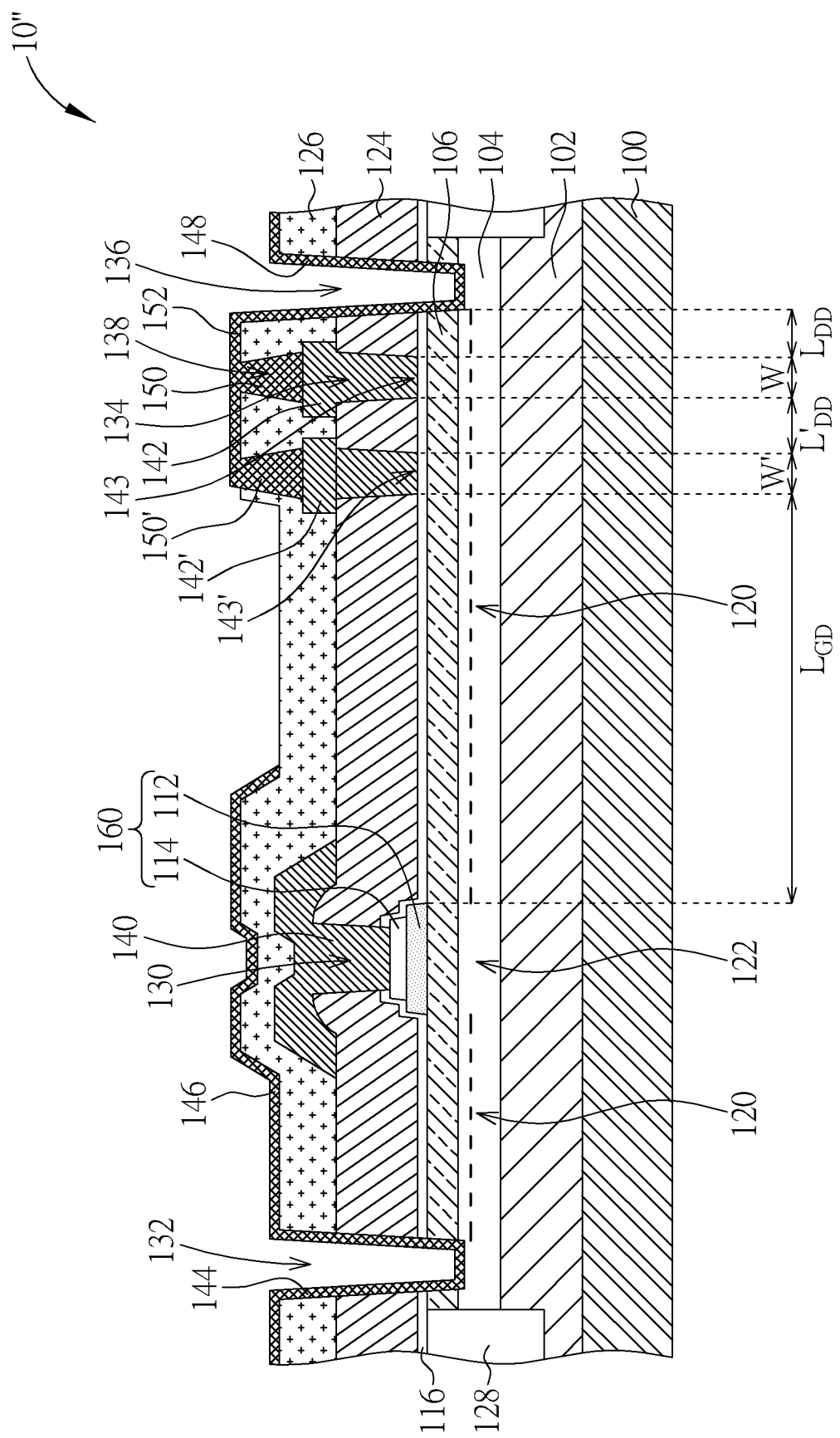
FIG. 4 is a schematic cross-sectional diagram of a high-voltage semiconductor device with a plurality of drain electrodes according to one embodiment of the present disclosure.

FIG. 4 is a schematic cross-sectional diagram of a high-voltage semiconductor device with a plurality of drain electrodes according to one embodiment of the present disclosure. The high-voltage semiconductor device shown in FIG. 4 may be, for example, an enhancement-mode high electron mobility transistor 10", and its structure may be similar to the enhancement-mode high electron mobility transistor 10 shown in FIG. 1. However, the main difference between the embodiment shown in FIG. 4 and the embodiment shown in FIG. 1 is that the enhancement-mode high electron mobility transistor 10" shown in FIG. 4 includes multiple first drain electrodes 142 and 142', and both of the drain electrodes 142 and 142' may form Schottky contacts with the underlying semiconductor layer, such as the group III-V barrier layer 106. The first drain electrode 142' may be disposed adjacent to the first drain electrode 142, and the bottom surfaces 143 and 143' of the two electrodes may be separated from each other to have a distance $L'D_D$. Depending on different requirements, the bottom width W' of the first drain electrode 142' may be the same or different from the bottom width W of the first drain electrode 142. The first drain electrode 142' may be electrically coupled to the first drain electrode 142 and the second drain electrode 148, for example, through a conducting plug 150' disposed on the top of the first drain electrode 142'. By providing multiple first drain electrodes 142 and 142', the distribution of electric field may be adjusted more flexibly.

In order to enable one of ordinary skill in the art to implement the present disclosure, a method of fabricating a high-voltage semiconductor device is further described below.

Figure 5:
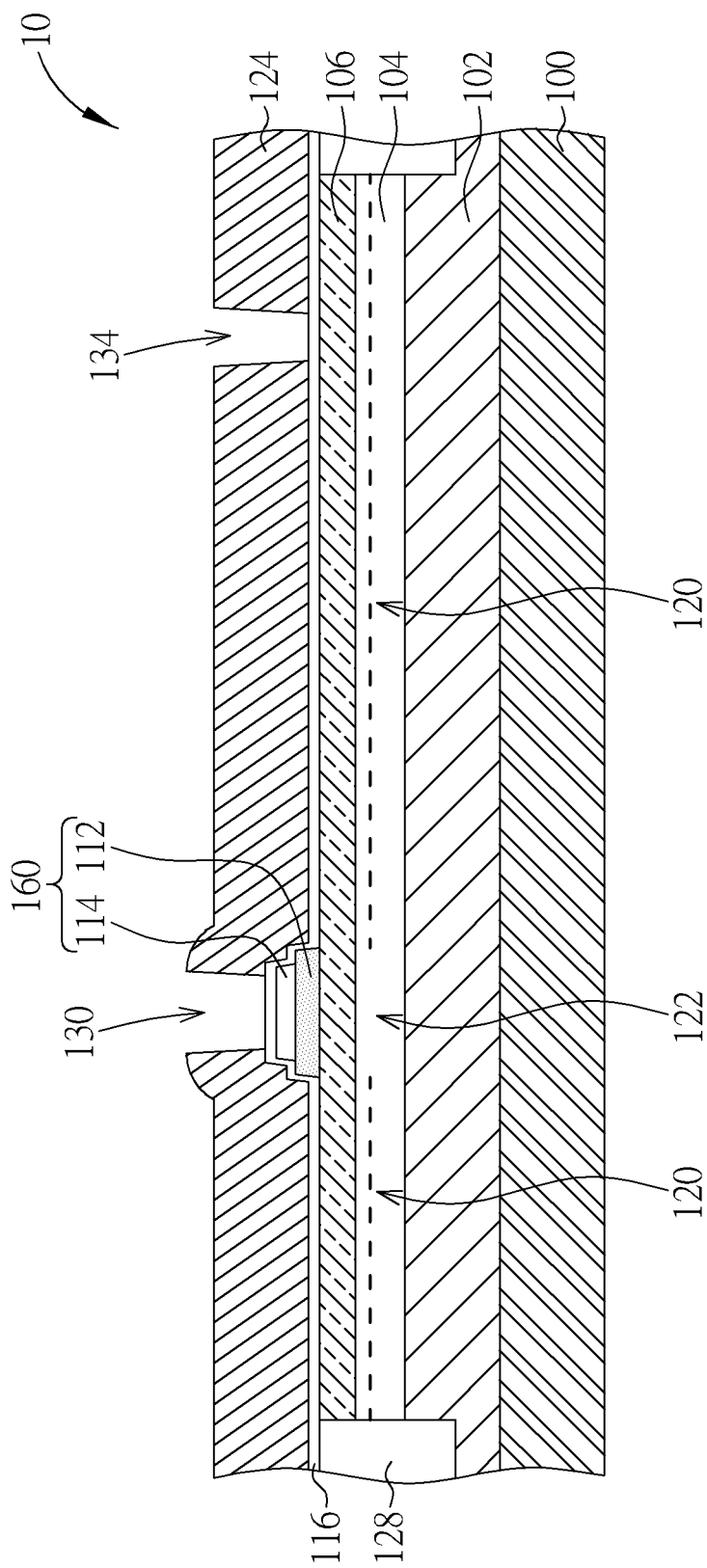
FIG. 5 is a schematic cross-sectional diagram of a high-voltage semiconductor device having a group III-V channel layer, a group III-V barrier layer, a group III-V semiconductor layer, and an etch stop layer disposed on a substrate according to one embodiment of the present disclosure.

FIG. 5 is a schematic cross-sectional diagram of a high-voltage semiconductor device having a group III-V channel layer, a group III-V barrier layer, a group III-V semiconductor layer, and an etch stop layer disposed on a substrate according to one embodiment of the present disclosure. Referring to FIG. 5, at one stage of fabricating a HEMT 20, multiple stacking layers may be sequentially stacked on a substrate 100, and the multiple stacking layers may include a buffer layer 102, a group III-V channel layer 104, a group III-V barrier layer 106, a stack structure 160, a passivation layer 116, and a first interlayer dielectric 124. Contact holes, such as a gate contact hole 130 and a first drain contact hole 134, may be disposed in the first interlayer dielectric 124 to expose the underlying passivation layer 116. The multiple stacking layers may be formed through any suitable growth processes, such as molecular-beam epitaxy (MBE), metal-organic chemical vapor deposition (MOCVD), hydride vapor phase epitaxy (HVPE), atomic layer deposition (ALD) or other suitable growth processes. The buffer layer 102 may include a plurality of sub-semiconductor layers (i.e., multiple layers) and the overall resistance of the buffer layer 102 may be higher than the resistance of other layers on the substrate 100. Specifically, the ratio of some elements, such as metal element, of the buffer layer 102 may be changed gradually along a direction from the substrate 100 to the group III-V channel layer 104. For example, for a case where the substrate 100 and the group III-V channel layer 104 are a silicon substrate and a GaN layer, respectively, the buffer layer 102 may be graded aluminum gallium nitride ($Al_xGa_{(1-x)}N$) where there is a continuous or stepwise decrease in the x ratio from 0.9 to 0.15.

Figure 6:
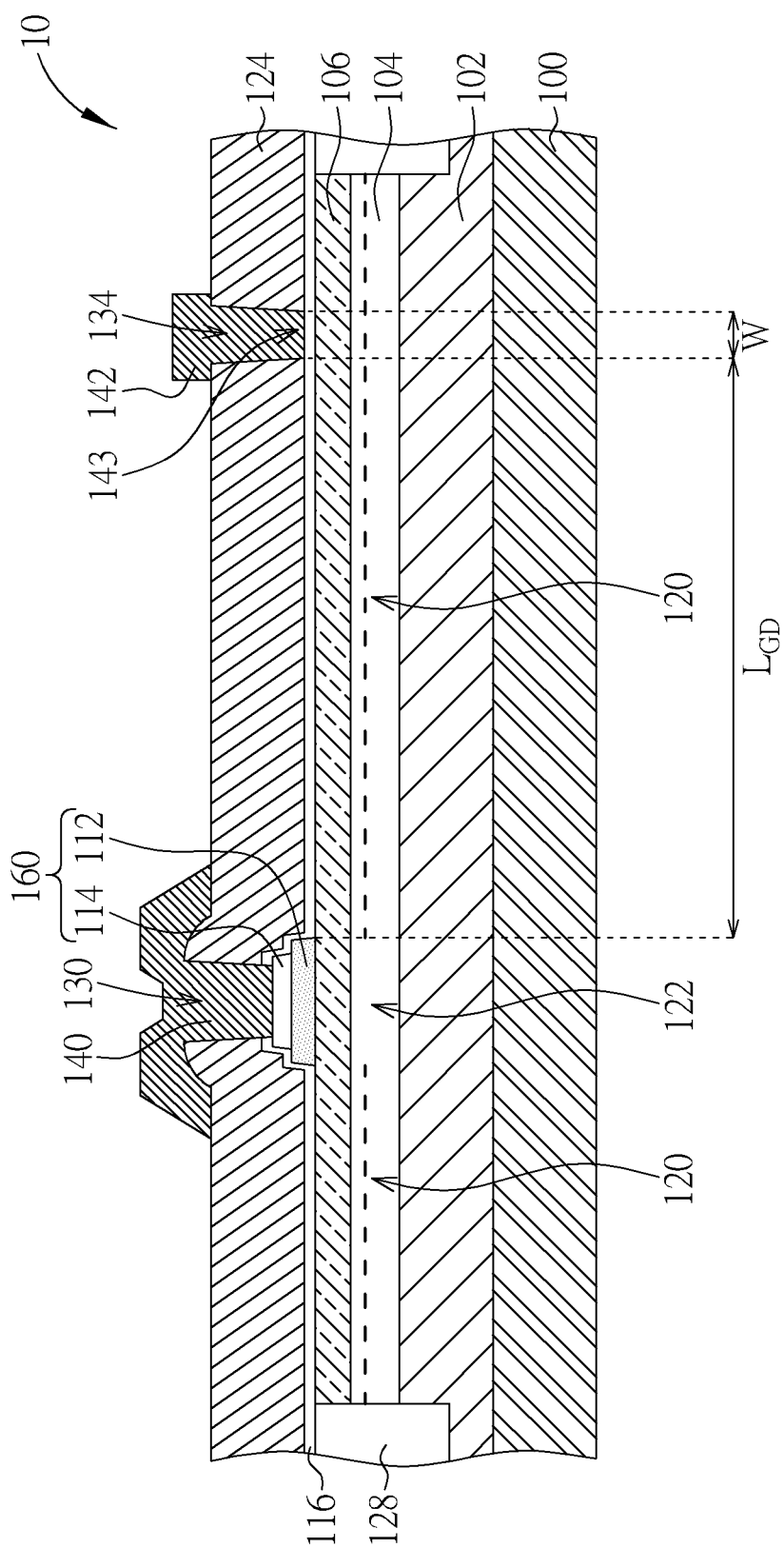
FIG. 6 is a schematic cross-sectional diagram of a high-voltage semiconductor device with a gate electrode and a first drain electrode disposed in an interlayer dielectric according to one embodiment of the present disclosure.

FIG. 6 is a schematic cross-sectional diagram of a high-voltage semiconductor device with a gate electrode and a first drain electrode disposed in an interlayer dielectric according to one embodiment of the present disclosure. Referring to FIG. 6, a suitable deposition process may be carried out to form a conducting layer, such as a composite conducting layer containing Schottky contact metal, on the top surface of the first interlayer dielectric 124, in the gate contact hole 130, and in the first drain contact hole 134. Afterwards, photolithography and etching processes are carried out to pattern the conducting layer to form a gate electrode 140 and a first drain electrode 142. According to one embodiment of the present disclosure, when the opening areas of the gate contact hole 130 and the first drain contact hole 134 are small enough, the conducting layer may completely fill up the gate contact hole 130 and the first drain contact hole 134, but not limited thereto.

Then, a blanket deposition of a second interlayer dielectric may be carried out to cover the first interlayer dielectric 124, the gate electrode 140, and the first drain electrode 142.

Figure 7:
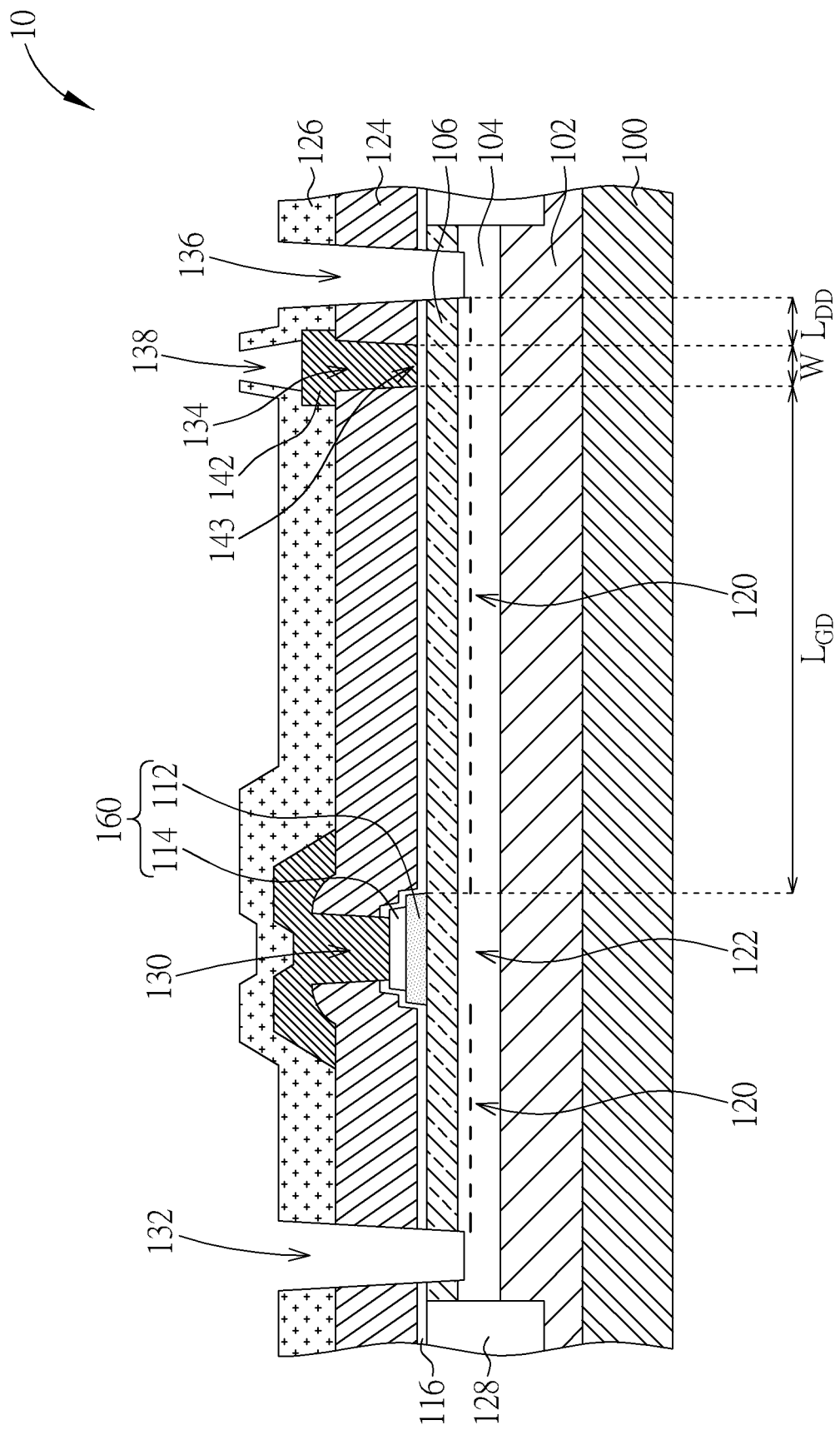
FIG. 7 is a schematic cross-sectional diagram of a high-voltage semiconductor device with a source contact hole and a second drain contact hole in the interlayer dielectric according to one embodiment of the present disclosure.

FIG. 7 is a schematic cross-sectional diagram of a high-voltage semiconductor device with a source contact hole and a second drain contact hole in the interlayer dielectric according to one embodiment of the present disclosure. Referring to FIG. 7, after forming the second interlayer dielectric 126 as described above, photolithography and etching processes may be carried out to form a source contact hole 132 and the second drain contact hole 136 separately disposed in the first interlayer dielectric 124 and the second interlayer dielectric 126. The bottoms of the source contact hole 132 and the second drain contact hole 136 may penetrate into the group III-V channel layer 104, but not limited thereto. Then, another photolithography and etching process may be performed to form an opening 138 in the second interlayer dielectric 126 so that the top surface of the first drain electrode 142 may be exposed from the opening 138.

Figure 8:
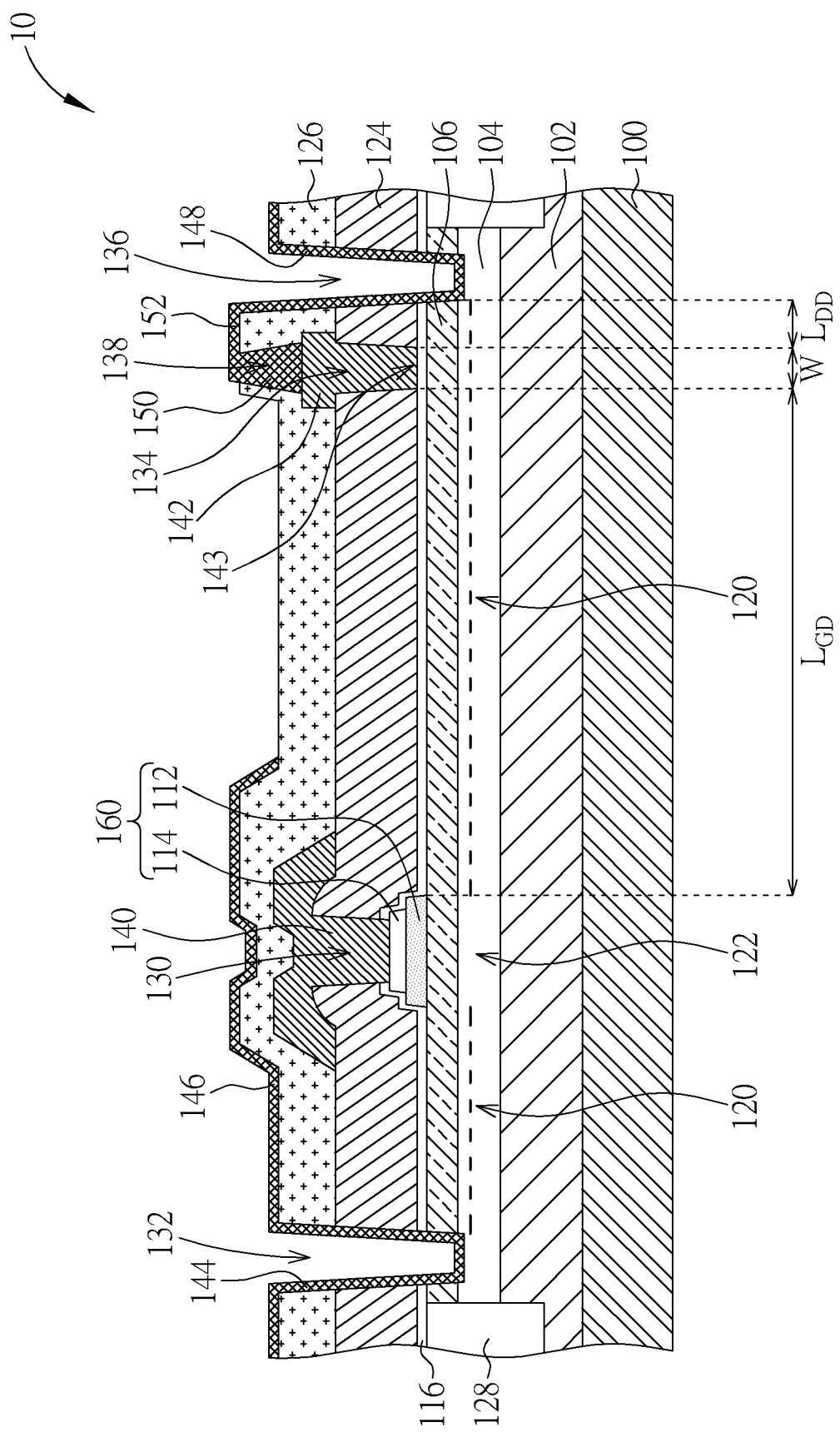
FIG. 8 is a schematic cross-sectional diagram of a high-voltage semiconductor device with a source electrode and a second drain electrode disposed in an interlayer dielectric layer according to one embodiment of the present disclosure.

FIG. 8 is a schematic cross-sectional diagram of a high-voltage semiconductor device with a source electrode and a second drain electrode disposed in an interlayer dielectric layer according to one embodiment of the present disclosure. Referring to FIG. 8, a conducting layer, such as a composite conducting layer containing ohmic contact metal, may be formed on the top surface of the second interlayer dielectric layer 126 and in the source contact hole 132, the second drain contact hole 136, and the opening 138 through a suitable deposition process. Afterwards, photolithography and etching processes are carried out to pattern the conducting layer to form a source electrode 144, a field plate 146, a second drain electrode 148, a conducting plug 150, and a conducting interconnection 152. According to one embodiment of the present disclosure, when the opening area of the opening 138 is small enough, the conducting layer may completely fill up the opening 138. However, when the opening areas of the source contact hole 132 and the second drain contact hole 136 are large enough, the conducting layer may conformally cover the sidewalls of the contact holes 132 and 136, but not limited thereto.

Then, a third interlayer dielectric may be deposited on the second interlayer dielectric 126, the source electrode 144, the field plate 146, the second drain electrode 148, the conducting plug 150, and the conducting interconnection 152 to obtain the high electron mobility transistor 10 shown in FIG. 1.

Figure 9:
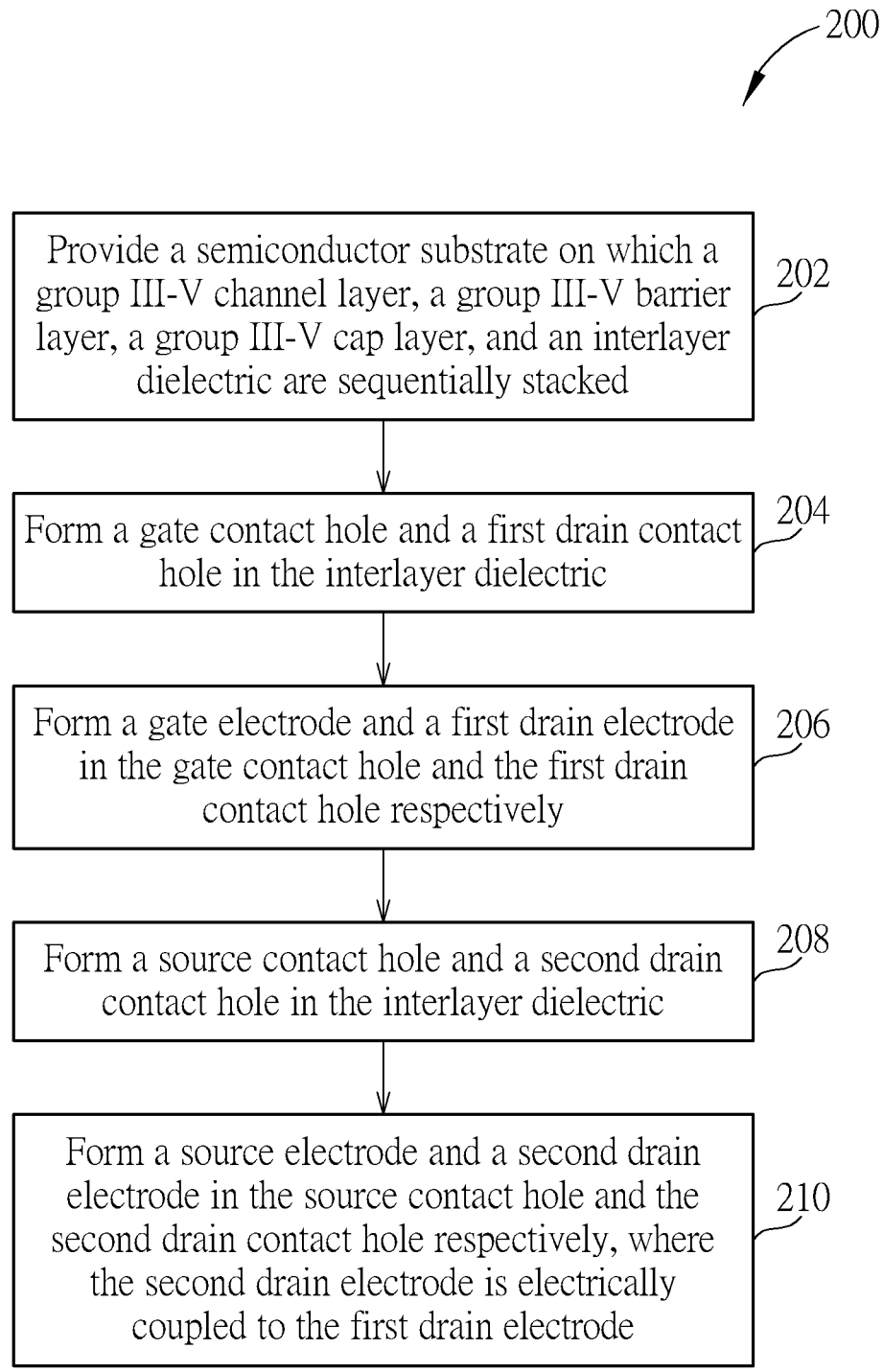
FIG. 9 is a flowchart illustrating a method of fabricating a high-voltage semiconductor device according to one embodiment of the present disclosure.

FIG. 9 is a flowchart illustrating a method of fabricating a high-voltage semiconductor device according to one embodiment of the present disclosure. Referring to FIG. 9, a method 200 for fabricating a high electron mobility transistor may include the following steps according to some embodiments of the present disclosure. Step 202: provide a semiconductor substrate on which a group III-V channel layer, a group III-V barrier layer, a group III-V cap layer, and an interlayer dielectric are sequentially stacked. Step 204: form a gate contact hole and a first drain contact hole in the interlayer dielectric. Step 206: form a gate electrode and a first drain electrode in the gate contact hole and the first drain contact hole respectively. Step 208: form a source contact hole and a second drain contact hole in the interlayer dielectric. Step 210: form a source electrode and a second drain electrode in the source contact hole and the second drain contact hole respectively, where the second drain electrode is electrically coupled to the first drain electrode.

According to some embodiments of the present disclosure, a high-voltage device may include a first drain electrode and a second drain electrode laterally separated from each other, where there is a Schottky contact between the first drain electrode and the underlying semiconductor layer, and there is an ohmic contact between the second drain electrode and the underlying semiconductor layer. Thus, the distribution of the electric field at the surface of the high-voltage device may be improved without overly increasing the contact area between the drain electrode and the underlying semiconductor layer, thereby not only reducing the $I_{OFF}$ of the device but also avoiding the increase in the $R_{ON}$ of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-electron mobility transistor, comprising: a group III-V channel layer, a group III-V barrier, and a group III-V cap layer sequentially disposed on a substrate; a source electrode disposed at one side of the group III-V cap layer; a first drain electrode and a second drain electrode disposed at another side of the group III-V cap layer, wherein a portion of a bottom surface of the first drain electrode is separated from a bottom surface of the second drain electrode, and a composition of the first drain electrode is different from a composition of the second drain electrode; and a connecting portion electrically coupled to the first drain electrode and the second drain electrode, wherein a Schottky contact is between the first drain electrode and the group III-V barrier layer, and an ohmic contact is between the second drain electrode and the group III-V channel layer.

2. The high-electron mobility transistor according to claim 1, wherein the bottom surface of the first drain electrode is higher than the bottom surface of the second drain electrode.

3. The high-electron mobility transistor according to claim 1, wherein the bottom surface of the first drain electrode and the bottom surface of the second drain electrode respectively contact different layers.

4. The high-electron mobility transistor according to claim 1, wherein the connecting portion comprises a conducting plug or a conducting interconnection, and a composition of the connecting portion is the same as the composition of the first drain electrode or the composition of the second drain electrode.

5. The high-electron mobility transistor as described in claim 1, further comprising:
an interlayer dielectric disposed on the group III-V barrier layer and comprising a first drain contact hole and a second drain contact hole, wherein the first drain contact hole is separated from the second drain contact hole;
the first drain electrode disposed in the first drain contact hole; and
the second drain electrode disposed in the second drain contact hole.

6. The high-electron mobility transistor according to claim 5, wherein the interlayer dielectric further comprises a gate contact hole disposed on a top surface of the group III-V cap layer.

7. The high-electron mobility transistor according to claim 6, further comprising an electrode disposed in the gate contact hole, wherein a composition of the gate electrode is the same as the composition of the first drain electrode.

8. The high electron mobility transistor according to claim 1, wherein the composition of the first drain electrode comprises TiN, W, Pt, Ni or Ni/Au.

9. The high-electron mobility transistor according to claim 1, wherein the composition of the second drain electrode comprises Ti/Al, Ti/Al/Ti/TiN, Ti/Al/Ti/Au, Ti/Al/Ni/Au or Ti/Al/Mo/Au.

10. A high-voltage semiconductor device, comprising: a semiconductor layer disposed on a substrate; a semiconductor cap layer disposed on the semiconductor layer; a source electrode disposed at one side of the semiconductor cap layer; at least two drain electrodes disposed at another side of the semiconductor cap layer, wherein each of the at least two drain electrodes comprises a Schottky contact metal and an ohmic contact metal; and an interlayer dielectric disposed between the Schottky contact metal and the ohmic contact metal, wherein the semiconductor layer comprises a group III-V channel layer and a group III-V barrier layer sequentially disposed on the substrate, and the Schottky contact metal penetrates the interlayer dielectric, and the ohmic contact metal penetrates the interlayer dielectric and the group III-V barrier layer.

11. The high-voltage semiconductor device according to claim 10, wherein the Schottky contact metal is electrically coupled to the ohmic contact metal.

12. The high-voltage semiconductor device according to claim 10, further comprising a gate electrode electrically coupled to the semiconductor cap layer, wherein a composition of the gate electrode is the same as a composition of the Schottky contact metal.

13. The high-voltage semiconductor device according to claim 10, further comprising a conducting plug disposed on the Schottky contact metal, wherein the conducting plug is electrically coupled to the Schottky contact metal and the ohmic contact metal.

14. The high-voltage semiconductor device according to claim 13, wherein a composition of the conducting plug is the same as a composition of the ohmic contact metal or a composition of the Schottky contact metal.

15. The high-voltage semiconductor device according to claim 13, further comprising a further interlayer dielectric disposed on the interlayer dielectric, wherein the further interlayer dielectric is disposed between the conducting plug and the ohmic contact metal.

16. The high-voltage semiconductor device according to claim 15, further comprising a conducting interconnection disposed on the surface of the further interlayer dielectric, wherein the conducting interconnection is electrically coupled to the conducting plug and the ohmic contact metal.

17. The high-voltage semiconductor device according to claim 10, wherein a Schottky contact is between the Schottky contact metal and the semiconductor layer, and an ohmic contact is between the ohmic contact metal and the semiconductor layer.

18. The high-voltage semiconductor device according to claim 10, wherein the at least two drain electrodes further comprise a further Schottky contact metal, and the further Schottky contact metal is separated from the Schottky contact metal and the ohmic contact metal.

* * * * *